United States Patent [19]

Glass et al.

[11] Patent Number: 5,148,056
[45] Date of Patent: Sep. 15, 1992

[54] OUTPUT BUFFER CIRCUIT

[75] Inventors: Kevin W. Glass, San Jose; Ashok Nagarajan, Fremont, both of Calif.

[73] Assignee: MOS Electronics Corp., Sunnyvale, Calif.

[21] Appl. No.: 676,780

[22] Filed: Mar. 27, 1991

[51] Int. Cl.$^5$ .................. H03K 17/16; H03K 17/687
[52] U.S. Cl. .................................... 307/443; 307/572
[58] Field of Search ............ 307/443, 475, 246, 247.1, 307/549, 550, 551, 542.1, 572, 573, 253, 254

[56] References Cited

U.S. PATENT DOCUMENTS

| | | | |
|---|---|---|---|
| 4,605,870 | 8/1986 | Dansky et al. | 307/443 |
| 4,678,940 | 7/1987 | Vasseghi et al. | 307/446 |
| 5,028,817 | 7/1991 | Patil | 307/443 |
| 5,028,818 | 7/1991 | Go Ang et al. | 307/443 |
| 5,047,669 | 9/1991 | Iwamura et al. | 307/443 X |

Primary Examiner—David Mis
Attorney, Agent, or Firm—Skjerven, Morrill, MacPherson, Franklin and Friel

[57] ABSTRACT

An output buffer circuit is disclosed that has optimized ground bounce characteristics while maintaining low propagation delay. The output buffer may be incorporated within an integrated circuit and may be embodied in either inverting or non-inverting and in either enabling and non-enabling configurations. The output buffer circuit includes a feedback means coupled to the output terminal of the output buffer and to a pull-down transistor. The feedback means provides a feedback voltage to the gate of the pull-down transistor to regulate the derivative of source current with respect to time. The feedback means includes a pair of field effect transistors and either an inverter gate or a NOR gate coupled across one of the feedback field effect transistors.

9 Claims, 5 Drawing Sheets

OUTPUT BUFFER CIRCUIT

BACKGROUND OF THE INVENTION

1. Field of the Invention

This invention relates to output buffer circuits and specifically to output buffer circuits having optimized ground-bounce characteristics.

2. Description of the Relevant Art

Output buffers are commonly used within integrated circuits to allow the coupling of data or control signals to external pins and thereby to circuits external to the integrated circuit. Four basic types of output buffers exist. One type is a non-inverting output buffer with an enable control line. Another type is an inverting output buffer with an enable control line. A third type is a non-inverting, non-enabling output buffer, and a fourth type is an inverting, non-enabling output buffer.

An important consideration in the design of each type of output buffer is the power required to drive the signal-receiving circuitry. Another important consideration is the signal propagation delay introduced by the output buffer. Particularly for output buffers used in high-speed applications, low propagation delays are desirable.

A typical output buffer includes an output stage comprised of a pair of field-effect transistors (FETs). One of the FETs, hereinafter called the pull-up transistor, is connected in a source-follower configuration between a logic high voltage source (i.e., 5 volts) and an output terminal. When the pull-up transistor is switched on by a signal at its associated control gate, the logic high voltage is provided through the transistor's low impedance path to the output terminal to thereby drive the signal-receiving circuitry.

The other FET in the output stage, hereinafter called the pull-down transistor, is connected in a common-source configuration between the output terminal and ground. When the pull-down transistor is switched on by a signal at its associated control gate, the output terminal is coupled to ground through the transistor's low impedance path and thereby provides a logic low signal to drive the signal-receiving circuitry.

A common problem associated with output buffers is the occurrence of a phenomenon known as "ground-bounce". Ground-bounce is a particular problem in integrated circuits that use high speed transistors, and occurs as a result of the parasitic inductance of the integrated circuit and packaging interconnect technology. Ground-bounce occurs when the pull-down transistor switches on during the period when the output terminal makes a transition from a logic high to a logic low state. When the pull-down transistor turns on, a surge of current flows from the output terminal through the pull-down transistor and through the parasitic inductance to ground. Since the voltage across an inductor is directly proportional to the derivative of current with respect to time, a decrease in the gate-to-source voltage in the pull-down transistor occurs. In the case where the pull-down transistor turns on very quickly, the derivative of current with respect to time is high and thus a relatively large decrease in gate-to-source voltage results. This decrease in gate-to-source voltage, called ground-bounce, in turn causes an increase in the overall propagation delay of the output buffer and can further cause corruption of the internal logic and ringing.

SUMMARY OF THE INVENTION

An output buffer circuit in accordance with the present invention has optimized ground-bounce characteristics while maintaining a low propagation delay. The output buffer may be incorporated within an integrated circuit and may be embodied in either inverting or non-inverting and in either enabling or non-enabling configurations.

These and other advantages are achieved in the present invention, in accordance with which an output buffer circuit comprises an output terminal, a reference voltage terminal for providing a reference voltage, and a switching means, such as a field-effect-transistor, coupled between the output terminal and the reference voltage terminal wherein the switching means includes a control terminal responsive to an input signal. The output buffer circuit further comprises a feedback means coupled to the output terminal and to the control terminal of the switching means for providing a voltage to the control terminal of the switching means indicative of a voltage of the output terminal.

In accordance with another aspect of the invention, an output buffer circuit comprises a first field-effect-transistor having a drain terminal coupled to a first supply terminal, a source terminal coupled to an output terminal, and a gate terminal coupled to an input terminal. The output buffer circuit further comprises a second field-effect-transistor having a drain terminal coupled to the output terminal, a source terminal coupled to a second supply terminal, and a gate terminal. A feedback means is coupled to the input terminal and to the output terminal. The feedback means includes a third transistor having a first terminal coupled to the output terminal, a gate terminal coupled to the input terminal, and a second terminal. The feedback means further includes a fourth field-effect-transistor having a first terminal coupled to the gate terminal of the second transistor, and a gate terminal coupled to the second terminal of the third transistor.

The invention will be more readily understood by reference to the drawings and the detailed description. As will be appreciated by one skilled in the art, the invention is applicable to output buffer circuits in general, and is not limited to the specific embodiments disclosed.

DETAILED DESCRIPTION OF THE INVENTION

The following includes a detailed description of the best presently contemplated mode for carrying out the invention. The description is intended to be merely illustrative of the invention and should not be taken in a limiting sense.

Figure 1:
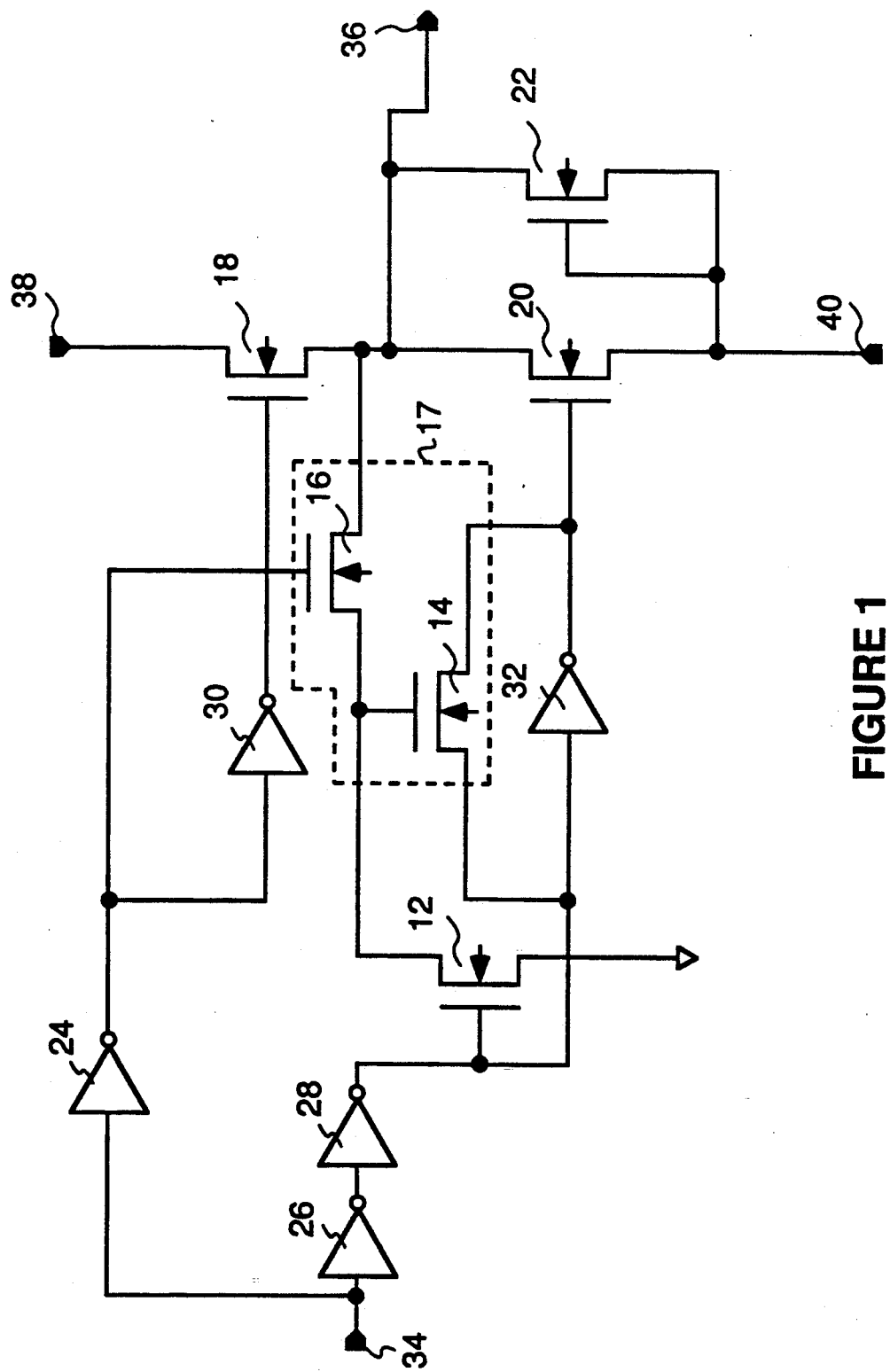
FIG. 1 is a schematic diagram illustrating a non-inverting, non-enabling output buffer in accordance with a first embodiment of the invention.

Referring to FIG. 1, a first embodiment of an output buffer circuit in accordance with the present invention is shown. The particular circuit of FIG. 1 is a non-inverting, non-enabling output buffer. It will be appreciated that the invention may be adapted to any of the four types of output buffer circuits.

The output buffer circuit includes N-channel MOS field effect transistors 12, 14, 16, 18, 20, and 22 and inverters 24, 26, 28, 30, and 32. The output buffer circuit receives data and/or control signals at input terminal 34 and provides buffered signals at output terminal 36. A power supply of approximately 5 volts is connected to terminal 38 with ground connected at terminal 40.

Transistors 18, 20, and 22 collectively comprise an output stage. Transistor 18 is connected in a source-follower configuration and is known as a pull-up transistor. Transistor 20 is connected in a common-source configuration and is known as a pull-down transistor. Transistor 22 has its gate and source terminals connected and is included to provide ESD (electrostatic discharge) protection. A series resistor may further be provided to limit current during an ESD discharge event.

Transistors 14 and 16 collectively comprise a feedback means 17 for providing a regulated voltage to the gate terminal of transistor 20. The regulated voltage is indicative of the voltage at output terminal 36. The overall operation of feedback means 17 will be better understood from the following description.

Figure 2:
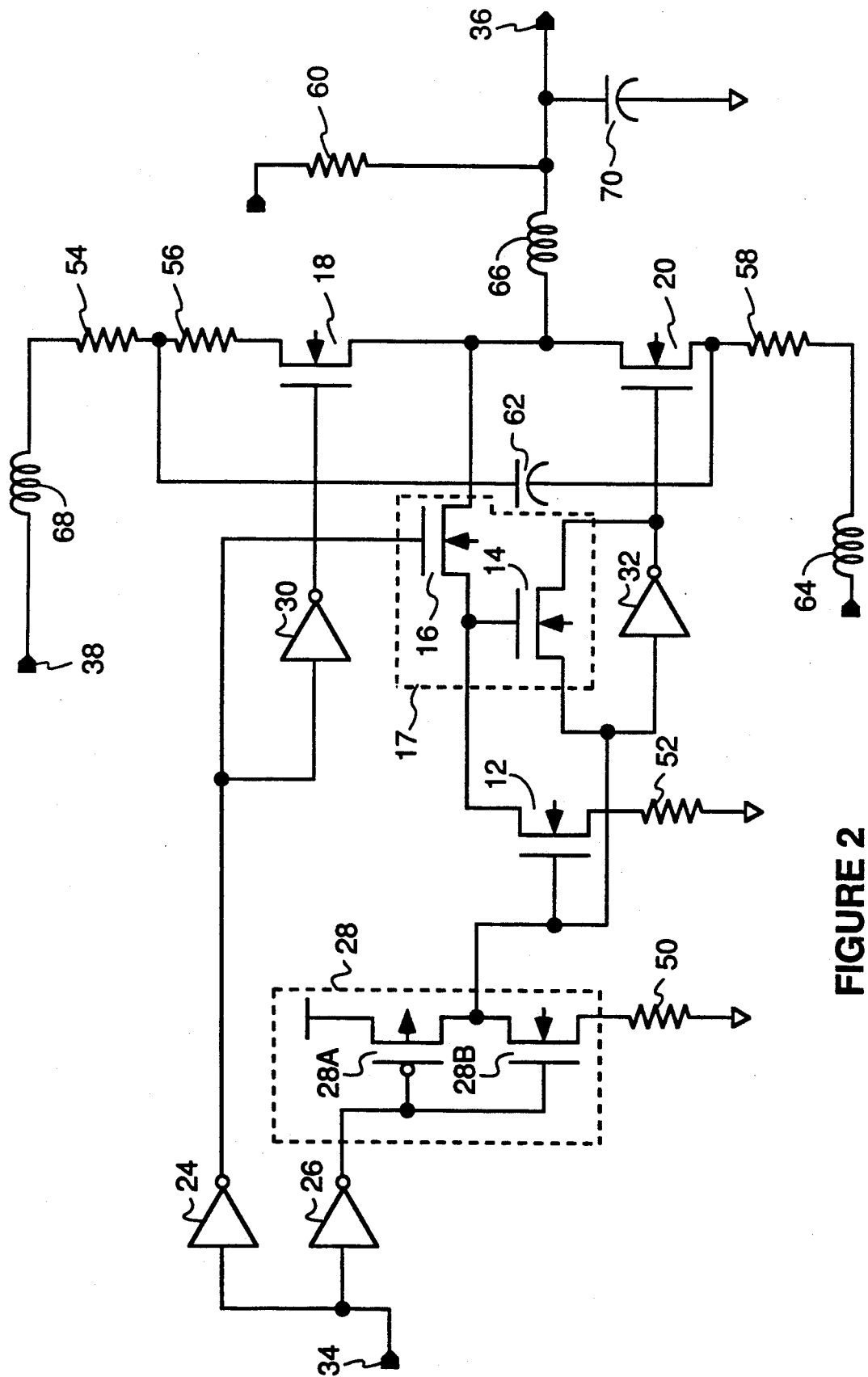
FIG. 2 is a circuit model illustrating parasitic resistance, capacitance, and inductance associated with the output buffer circuit of FIG. 1.

FIG. 2 shows an equivalent circuit model illustrating the associated parasitic elements of the output buffer of FIG. 1. Corresponding components in the Figures are numbered identically. The circuit model of FIG. 2 includes parasitic resistance 50, 52, 54, 56, and 58, parasitic capacitance 62, and parasitic inductance 64, 66, and 68. Resistor 60 is included to simulate an optionally user-provided bus pull-up resistor. Capacitor 70 represents the sum of the capacitance between output terminal 36 and ground due to parasitic elements. Furthermore, inverter 28 is shown comprising p-channel FET 28A and n-channel FET 28B.

The operation of the output buffer circuit is next considered with reference to FIGS. 1 and 2. When a logical high signal is applied at input terminal 34, the output terminal of inverter 24 goes low and the output terminals of inverters 28 and 30 go high. Accordingly, following the respective propagation delays of inverters 24 and 30, transistor 18 turns on and following the respective propagation delays of inverters 26 and 28, transistor 12 turns on. In addition, since the output terminal of inverter 32 goes low, transistor 20 turns off. The high voltage at terminal 38 is therefore provided to output terminal 36 through the low impedance path of transistor 18. It should be noted that during this particular signal state of the output buffer circuit, transistors 14 and 16 are turned off.

When the signal applied to input terminal 34 goes low, the output lines of inverters 24 and 32 go high and the output lines of inverters 28 and 30 go low. Accordingly, transistor 16 turns on following the propagation delay of inverter 24 and transistor 20 turns on following the respective propagation delays of inverters 26, 28, and 32. Furthermore, transistor 12 turns off following the respective propagation delays of inverters 26 and 28, and transistor 18 turns off following the respective propagation delays of inverters 24 and 30.

It is noted that transistor 16 turns on slightly before transistor 20 since only one gate delay (inverter 24) is associated with the signal path to the control gate of transistor 16 compared with the three gate delays (inverters 26, 28, and 32) associated with the signal path to the control gate of transistor 20. Similarly, transistor 16 also turns on slightly before transistor 18 turns off since two gate delays (inverters 24 and 30) are associated with the signal path to the control gate of transistor 18. Consequently, immediately after transistor 16 turns on and transistor 18 turns off, the logical high voltage at output terminal 36 is provided to the control gate of transistor 14 through the low impedance path of transistor 16. Transistor 14 accordingly turns on strong. When transistor 14 turns on, the voltage at the control gate of transistor 20 rises from 0 volts to a level of less than 5 volts. This rise in gate voltage of transistor 20 is relatively slow due to the effect of the conductive path through transistor 14 across the input and output lines of inverter 32. In response to the rise in gate voltage, transistor 20 turns on relatively slowly and provides a gradually lowering impedance path between output terminal 36 and ground. The voltage at output terminal 36 consequently lowers. The decrease in the voltage at output terminal 36 in turn causes the impedance of transistor 14 to increase which thereby causes the voltage at the control gate of transistor 20 to increase. When the voltage at output terminal 36 reaches approximately 0.7 volts, transistor 14 turns off completely and thus the voltage at the control gate of transistor 20 reaches and remains at five volts until the state of the input signal changes.

As a result of the feedback means 17 comprised of transistors 14 and 16, the voltage at the control gate of transistor 20 is regulated. The derivative of current flowing through transistor 20 with respect to time is thereby reduced, and the associated ground-bounce characteristic is thus optimized. By optimizing the ground-bounce characteristic, the propagation delay for a high-to-low change in output state is minimized. In addition, ringing is reduced and corruption of internal logic is prevented.

Figure 3:
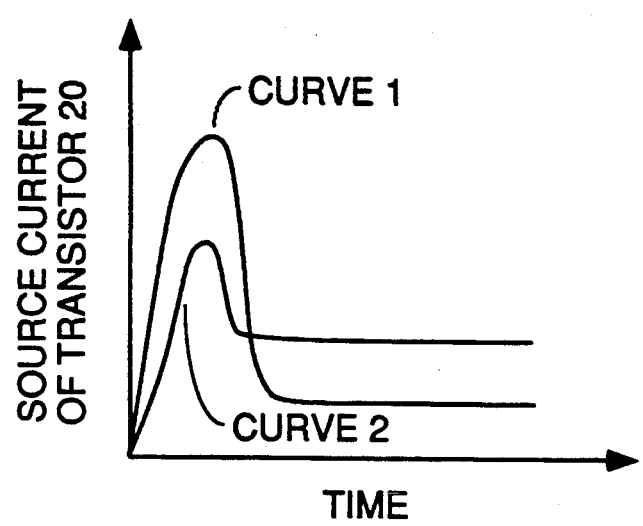
FIG. 3 is a graph illustrating pull-down transistor source current with respect to time. Curve 1 represents the source current with respect to time when a feedback means is not connected within the output buffer circuit, and Curve 2 represents the source current with respect to time when a feedback means is connected within the output buffer circuit in accordance with the invention.

Referring to FIG. 3, a graph is shown which comparatively illustrates the effect of feedback means 17. Curve 1 represents the current flowing through transistor 20 with respect to time when feedback means 17 is not connected within the output buffer, and Curve 2 represents the current with respect to time when the feedback means is incorporated within the output buffer. Both curves represent the initial change in source current when transistor 20 is turned on.

From a comparison of Curves 1 and 2, it is evident that the initial change in current with respect to time is much greater when the feedback means is not incorporated within the output buffer. This large change in current causes a dramatic ground-bounce effect. Since the change in current with respect to time flowing through the source of transistor 20 is decreased when feedback means 17 is connected to the output buffer in accordance with the present invention, the voltage induced across the parasitic inductance 64 is decreased, and hence, the gate-to-source voltage of transistor 20 is increased. The increase in gate-to-source voltage results in an optimized ground-bounce characteristic and a decreased overall propagation delay for the output buffer.

Figure 4:
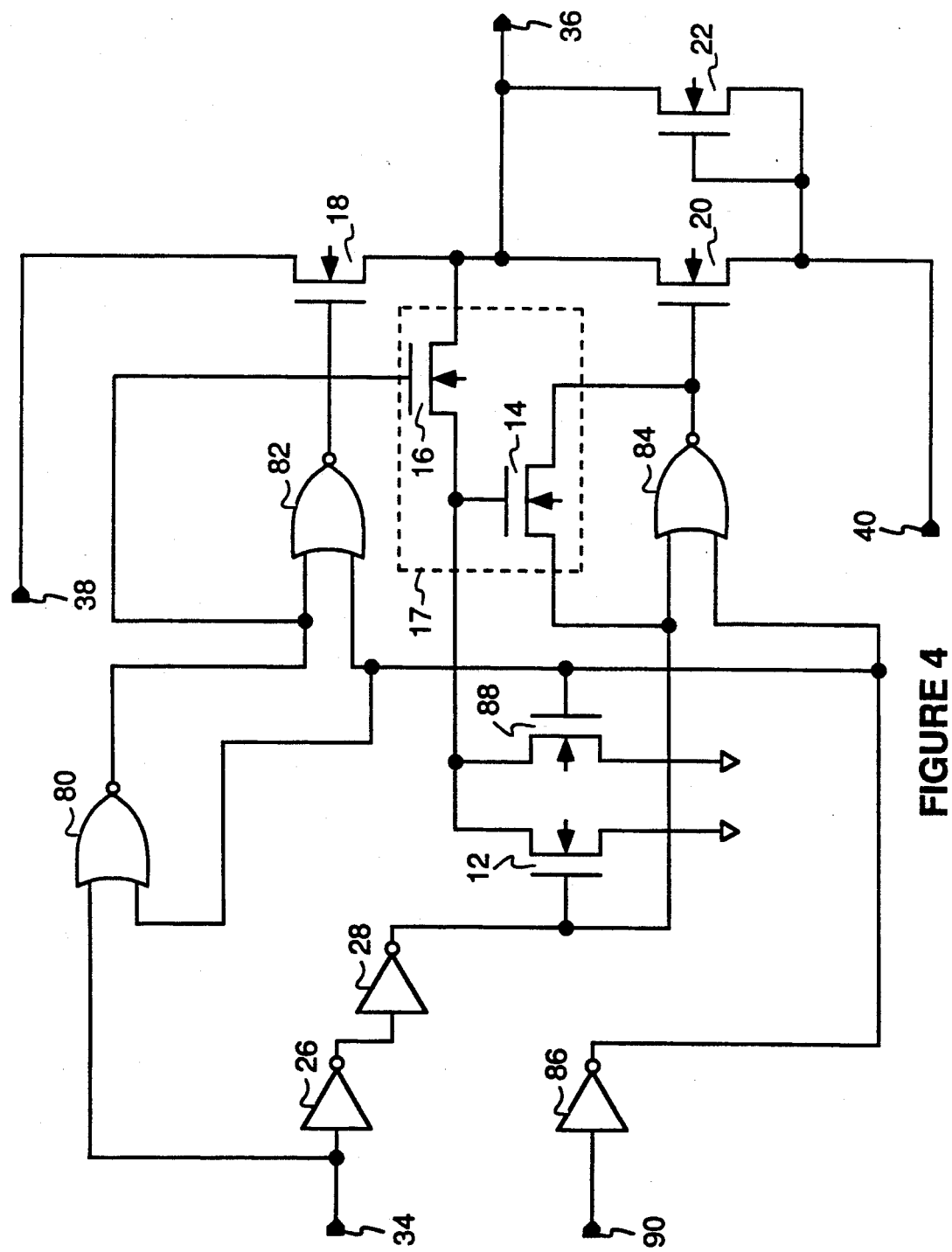
FIG. 4 is a schematic diagram illustrating a non-inverting output buffer with an enable control line in accordance with a second embodiment of the invention.
Figure 5:
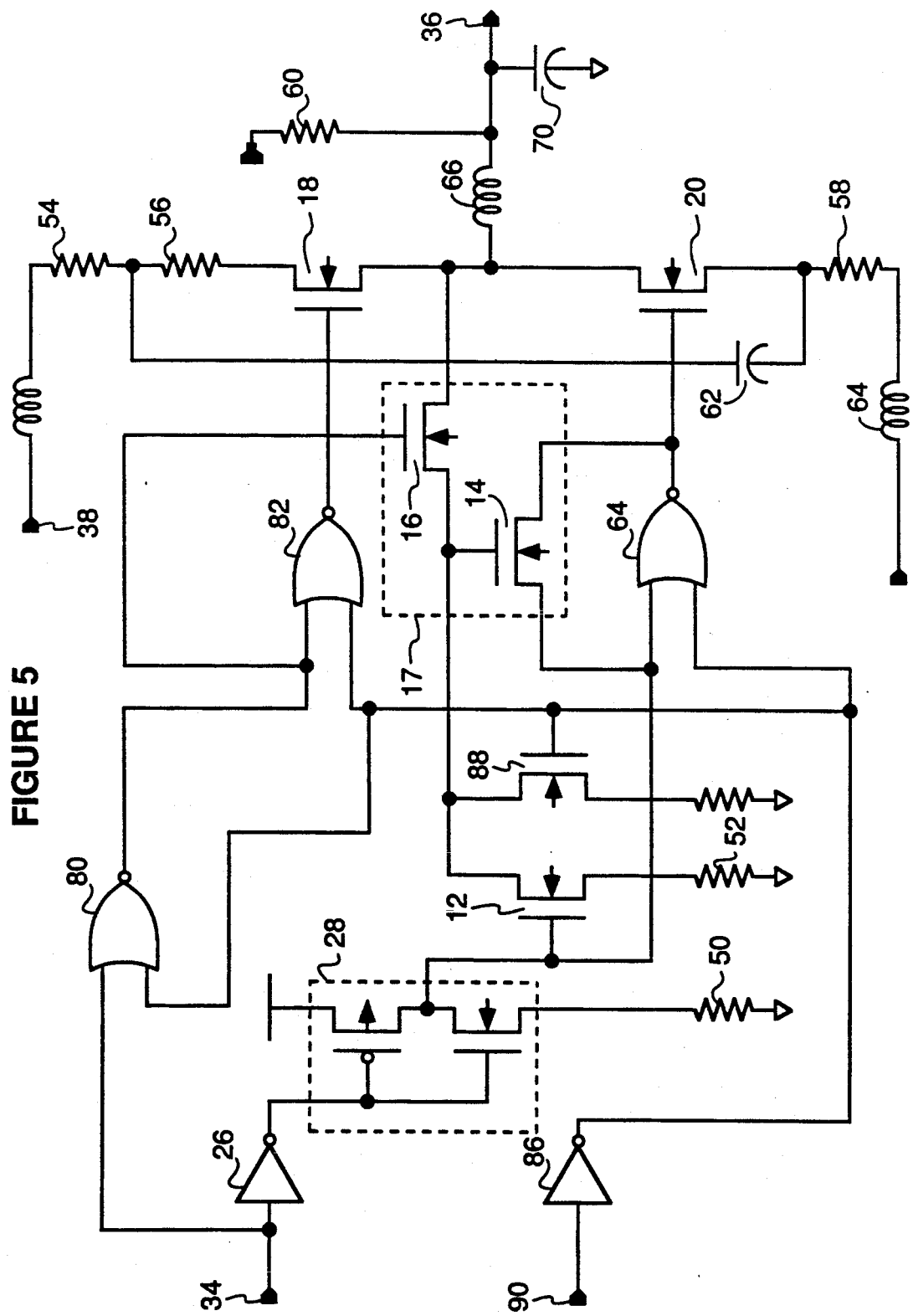
FIG. 5 is a circuit model illustrating parasitic resistance, capacitance, and inductance associated with the output buffer circuit of FIG. 4.

FIG. 4 shows a second embodiment of an output buffer circuit in accordance with the present invention, and FIG. 5 shows a corresponding circuit model including parasitic resistance, capacitance, and inductance. The circuit of FIG. 4 is a non-inverting output buffer with an enable control line.

Several components shown in the circuit of FIGS. 4 and 5 correspond similarly to those described above with reference to the circuit of FIGS. 1 and 2. Corresponding components of FIGS. 1, 2, 4 and 5 are numbered identically, and the corresponding descriptions thereof are omitted below.

In addition, the inverter gates 24, 30, and 32 of the circuit of FIG. 1 are replaced with NOR gates 80, 82, and 84. The output buffer circuit of FIGS. 4 and 5 additionally includes an inverter 86, an N-channel field-effect-transistor 88, and an enable control line 90 for receiving an enabling signal.

When the enabling signal at enable control line 90 is low, the output lines of NOR gates 82 and 84 are low. Accordingly, transistors 18 and 20 are turned off and the voltage at output terminal 36 floats. Transistor 88 is furthermore turned on to maintain the off-states of transistor 12, 14 and 16.

When the enabling signal at enable control line 90 is high, the circuit has a substantially identical operation as that described above in conjunction with FIG. 1. If a signal at input terminal 34 goes high, transistor 16 is turned off and hence feedback means 17 is disabled. In addition, transistor 18 turns on and thus the voltage at the output terminal goes high.

When the signal at input terminal 34 goes low, transistors 14 and 16 turn on to thus regulate the voltage at the gate of transistor 20. This active regulation of the gate voltage of transistor 20 thereby decreases the derivative of source current with respect to time flowing therethrough. As explained above, such regulation decreases the overall propagation delay of the output buffer, and reduces ringing and other circuit instabilities.

It is furthermore evident that the present invention may be embodied within an inverting, non-enabling output buffer circuit or within an inverting output buffer circuit with an enable control line. Such inverting output buffer circuits could be embodied by connecting an inverter at input terminal 34.

Numerous modifications and variations will become apparent to those skilled in the art once the above disclosure is fully appreciated. It is to be understood that the above detailed description of the preferred embodiments is intended to be merely illustrative of the spirit and scope of the invention and should not be taken in a limiting sense. The scope of the claimed invention is better defined with reference to the following claims.

We claim:

1. An output buffer circuit comprising:
    an input terminal;
    an output terminal;
    a first supply terminal for providing a first reference voltage;
    a second supply terminal for providing a second reference voltage;
    a first field-effect-transistor having a drain terminal coupled to said first supply terminal, a source terminal coupled to said output terminal, and a gate terminal coupled to said input terminal;
    a second field-effect-transistor having a drain terminal coupled to said output terminal, a source terminal coupled to said second supply terminal, and a gate terminal; and
    feedback means coupled to said input terminal and to said output terminal, said feedback means including:
        a third field-effect-transistor having a first terminal coupled to said output terminal, a gate terminal coupled to said input terminal, and a second terminal; and
        a fourth field-effect-transistor having a first terminal coupled to said gate terminal of said second field-effect-transistor, and a gate terminal coupled to the second terminal of said third transistor.

2. The output buffer circuit as recited in claim 1 further comprising an inverter gate wherein the first and second terminals of said fourth transistor are connected in parallel with said inverter gate.

3. The output buffer circuit as recited in claim 1 further comprising a NOR gate having a first input line and an output line, wherein the first terminal of said fourth transistor is connected to the output line of said NOR gate and wherein the second terminal of said fourth transistor is connected to the output line of said NOR gate.

4. The output buffer circuit as recited in claim 3 wherein said NOR gate includes a second input line and wherein an enable control line is coupled to the second input line of said NOR gate.

5. The output buffer circuit as recited in claim 2 further comprising a fifth field-effect-transistor having a first terminal coupled to said output terminal and a gate terminal coupled to said second supply terminal.

6. The output buffer circuit as recited in claim 3 further comprising a fifth field-effect-transistor having a first terminal coupled to said output terminal and a gate terminal coupled to said second supply terminal.

7. The output buffer circuit as recited in claim 5 further comprising a sixth field-effect-transistor having a first terminal coupled to the gate terminal of said fourth field-effect-transistor and a gate terminal coupled to said input terminal.

8. The output buffer circuit as recited in claim 6 further comprising a sixth field-effect-transistor having a first terminal coupled to the gate terminal of said fourth field-effect-transistor and a gate terminal coupled to said input terminal.

9. The output buffer circuit as recited in claim 7 further comprising a second inverter gate and a third inverter gate connected in series between the gate terminal of said sixth transistor and said input terminal.

* * * * *